United States Patent
Lee et al.

(10) Patent No.: US 8,319,917 B1
(45) Date of Patent: Nov. 27, 2012

(54) COLOR FILTER COMPOSITION

(75) Inventors: Yui-Ku Lee, Asan-si (KR); Sang Hun Lee, Suwon-si (KR); Yun Ho Lee, Cheonan-si (KR); Se Ah Kwon, Seoul (KR); Sun-Young Chang, Gwangmyeong-si (KR); Jin A Seo, Seoul (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 13/430,556

(22) Filed: Mar. 26, 2012

(30) Foreign Application Priority Data

Sep. 5, 2011 (KR) .......................... 10-2011-0089699

(51) Int. Cl.
*G02F 1/1335* (2006.01)
*G02B 5/23* (2006.01)
*G02B 5/22* (2006.01)

(52) U.S. Cl. ................ 349/106; 252/586; 257/E31.127; 257/432; 359/885; 522/74; 524/81; 524/92

(58) Field of Classification Search ................... 349/106; 252/586; 257/E31.127, 432; 359/885; 522/74; 524/81, 92
See application file for complete search history.

(56) References Cited

U.S. PATENT DOCUMENTS

| 3,223,527 | A | * | 12/1965 | Dreyfuss | ................. | 430/390 |
|---|---|---|---|---|---|---|
| 4,098,793 | A | * | 7/1978 | Ribaldone et al. | ............ | 548/134 |
| 6,653,031 | B2 | | 11/2003 | Baba et al. | | |
| 7,781,129 | B2 | | 8/2010 | Tatsuzawa et al. | | |
| 2007/0264587 | A1 | | 11/2007 | Hu et al. | | |
| 2008/0171271 | A1 | * | 7/2008 | Kim et al. | ................. | 430/7 |

FOREIGN PATENT DOCUMENTS

| JP | 10-237326 | 9/1998 |
|---|---|---|
| JP | 10-237327 | 9/1998 |
| JP | 11-209631 | 8/1999 |
| JP | 11-209632 | 8/1999 |
| JP | 2002-229198 | 8/2002 |
| JP | 2002-303717 | 10/2002 |
| JP | 2002-357712 | 12/2002 |
| KR | 10-2007-0019450 A | 2/2007 |
| KR | 10-2009-0072220 A | 7/2009 |
| KR | 10-2010-0105190 A | 9/2010 |
| KR | 10-1028589 B | 4/2011 |

* cited by examiner

*Primary Examiner* — Bijan Ahvazi
(74) *Attorney, Agent, or Firm* — Innovation Counsel LLP

(57) ABSTRACT

A color filter composition is provided. The color filter composition according to an exemplary embodiment includes a colorant A including a pigment or a dye, a binder resin B, an initiator C, and an assistance colorant D, wherein the initiator absorbs light of an ultraviolet wavelength, and the assistance colorant has a transmittance of more than 60% between about wavelengths 300 nm to 400 nm.

9 Claims, 7 Drawing Sheets

COLOR FILTER COMPOSITION

CROSS-REFERENCE TO RELATED APPLICATION

This application claims priority to and the benefit of Korean Patent Application No. 10-2011-0089699 filed in the Korean Intellectual Property Office on Sep. 5, 2011, the entire contents of which are incorporated herein by reference.

BACKGROUND OF THE INVENTION (a) Field of the Invention

The present invention relates to a color filter composition.

(b) Description of the Related Art

Color filters are widely used in image sensing devices and in flat panel displays such as liquid crystal displays and organic electroluminescence devices, the application range for which has been rapidly widening.

The color filter used in a flat panel display or an image sensing device is typically manufactured by forming a pixel (emitter or sensor) of each primary color of red, green, and blue by repetitively forming a uniform coating of a colored photosensitive resin composition on a substrate including a black matrix. Each resin composition includes an appropriate pigment corresponding to each color, and the process is repeated to obtain the desired variety of colors. Subsequently, the coating layer is exposed and developed by primary baking (hereinafter referred to as heat drying or primary firing), and then, if necessary, by secondary baking (hereinafter referred to as a heat hardening or secondary firing).

In particular, liquid crystal displays for notebook PCs and mobile devices use color filters with high color purity and outstanding transmission characteristics. If a resin composition including the colored material has poor sensitivity to exposure, various defects due to generation of an undercut periphery may be generated. The undercut is caused by depth-dependent variation in the photohardening rate during the development process, such that the color filter material at the interface with the substrate develops more than the overlying layer.

To increase the composition's sensitivity to exposure, an initiator having an excellent photohardening property may be used and the concentration of the initiator may be increased. However, this method may increase the manufacturing cost, and causes a transmittance reduction due to the increased concentration of the initiator.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention provides a color filter composition with improved sensitivity under exposure.

A color filter composition according to an exemplary embodiment includes a colorant A including a pigment or a dye, a binder resin B, an initiator C, and an assistance colorant D, wherein the initiator absorbs light of an ultraviolet wavelength, and the assistance colorant has transmittance of more than about 60% in a short wavelength region.

The short wavelength region may be in a range of about 300 nm to about 400 nm.

The assistance colorant may be a yellow assistance colorant.

The assistance colorant may include at least two azo groups.

The assistance colorant may include a functional group substituted into a sulfonyl group.

The assistance colorant may be represented by Chemical Formula 1 below.

[Chemical Formula 1]

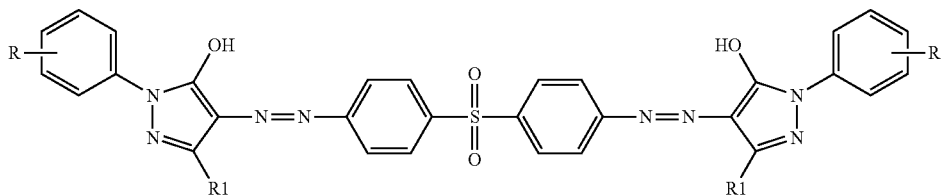

In Chemical Formula 1, R and R1 may the same or different from each other and may be one of hydrogen, a hydroxyl group, an alkyl group with a carbon number of 1 to 30, an alkenyl group with a carbon number of 2 to 30, an oxyalkyl group with a carbon number of 1 to 30, a cycloalkyl group with a carbon number of 3 to 30, an aryl group with a carbon number of 6 to 30, derivatives thereof, or polymers thereof.

The assistance colorant may be represented by Chemical Formula 2 below.

[Chemical Formula 2]

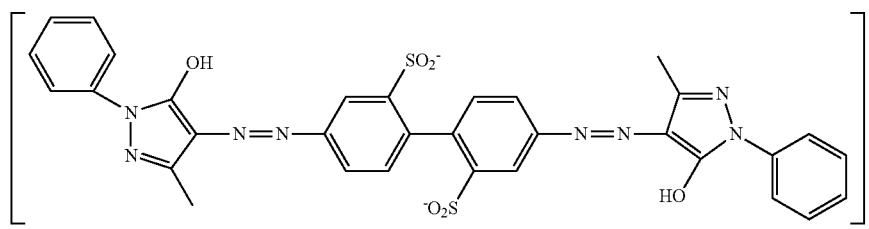

The assistance colorant may be an anthraquinone-based material.

The assistance colorant may be represented by Chemical Formula 3 below.

[Chemical Formula 3]

In Chemical Formula 3, R1 may be one of hydrogen, a hydroxyl group, an alkyl group with a carbon number of 1 to 30, an alkenyl group with a carbon number of 2 to 30, an oxyalkyl group with a carbon number of 1 to 30, a cycloalkyl group with a carbon number of 3 to 30, an aryl group with a carbon number of 6 to 30, derivatives thereof, or polymers thereof.

The assistance colorant may have a transmittance of more than about 80% for the short wavelength region of 300 nm to 400 nm.

As described above according to an exemplary embodiment, an assistance colorant having high transmittance in the short wavelength region is formulated into the color filter composition, thereby improving sensitivity.

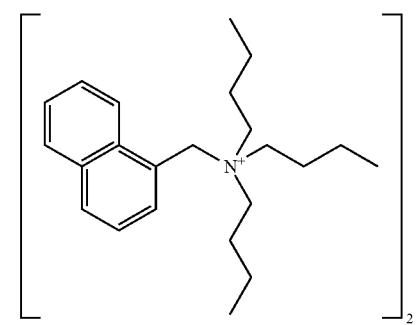

Figure 6:
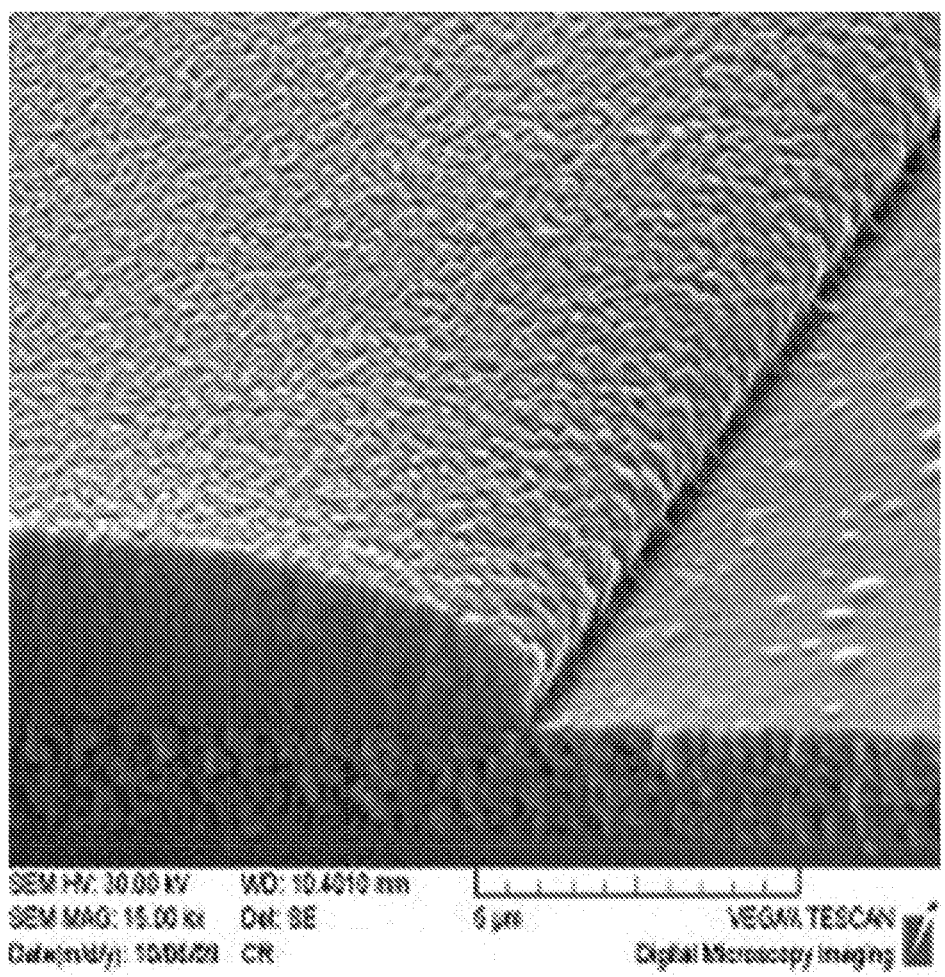
Figure 7:
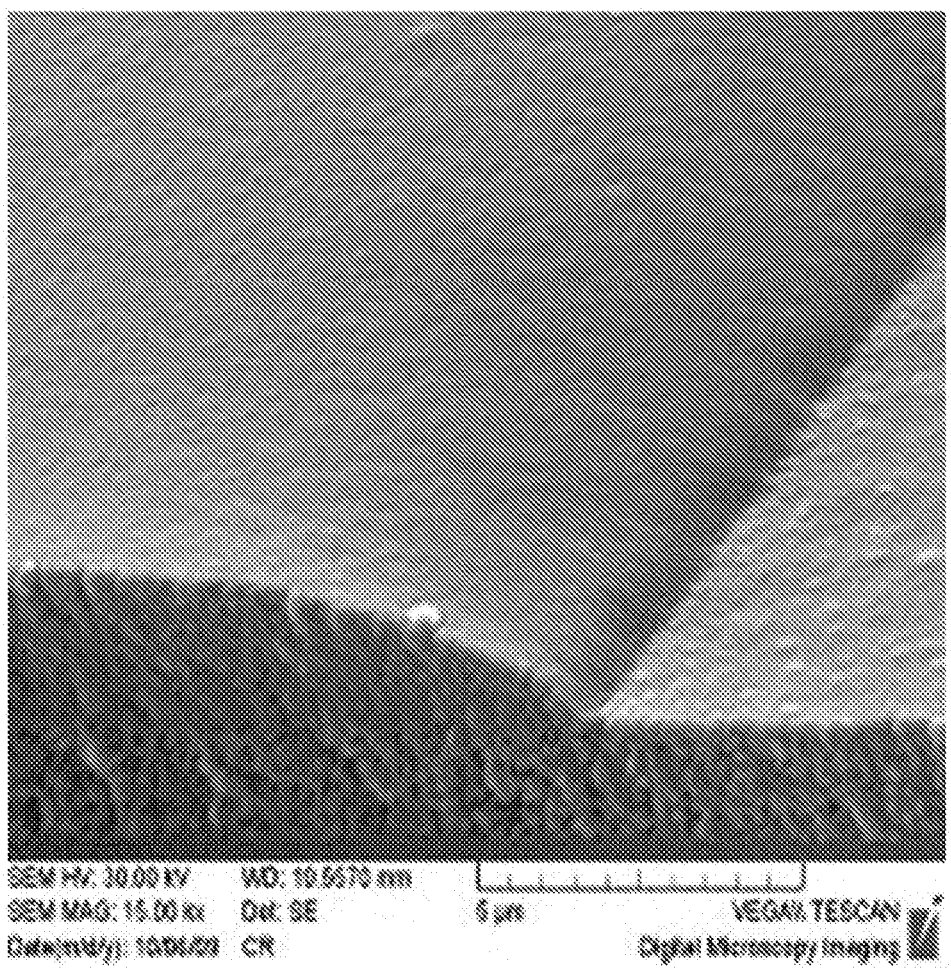

FIG. 6 and FIG. 7 are SEM pictures after a development process and after a baking process for an exemplary embodiment.

DETAILED DESCRIPTION OF THE EMBODIMENTS

The present invention will be described more fully hereinafter with reference to the accompanying drawings, in which exemplary embodiments of the invention are shown. However, it is to be understood that the invention is not limited to the disclosed embodiments, but, on the contrary, is intended to cover various modifications. As those skilled in the art would realize, the described embodiments may be modified in various different ways, all without departing from the spirit or scope.

In the drawings, the thickness of layers, films, panels, regions, etc., are exaggerated for clarity. It will be understood that when an element such as a layer, film, region, or substrate is referred to as being "on" another element, it can be directly on the other element or intervening elements may also be present. Like reference numerals designate like elements throughout the specification.

A color filter composition according to an exemplary embodiment comprises a colorant A including a pigment or a dye, a binder resin B, an initiator C, and an assistance colorant D. Here, the initiator absorbs light of an ultraviolet wavelength, and the assistance colorant has transmittance of more than about 60% in the short wavelength range from about 300 nm to about 400 nm. The assistance colorant may be a yellow assistance colorant. The color filter composition may further include an additive, a monomer, a solvent, etc.

The initiator may be an acetophenone-based, triazine-based, oxime-based, or benzophenone-based compound.

The assistance colorant according to the present exemplary embodiment may be a pigment or a dye.

The assistance colorant according to the present exemplary embodiment may include at least two azo groups. An example is an assistance colorant having two azo groups like the assistance colorant represented by Chemical Formula 1, which may include functional groups substituted onto a sulfonyl group. The assistance colorant according to the present exemplary embodiment may have a transmittance of more than about 40% and preferably about 80% in the short wavelength region of less than about 400 nm.

[Chemical Formula 1]

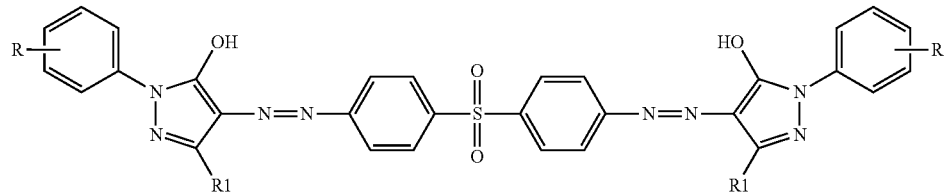

In Chemical Formula 1, R and R1 may the same or different, and may be one of hydrogen, a hydroxyl group, an alkyl group with a carbon number of 1 to 30, an alkenyl group with a carbon number of 2 to 30, an oxyalkyl group with a carbon number of 1 to 30, a cycloalkyl group with a carbon number of 3 to 30, an aryl group with a carbon number of 6 to 30, derivatives thereof, or polymers thereof.

The assistance colorant according to another exemplary embodiment may be an assistance colorant represented by Chemical Formula 2 below. The assistance colorant represented by Chemical Formula 2 may also have high transmittance in the short wavelength region of less than about 400 nm.

[Chemical Formula 2]

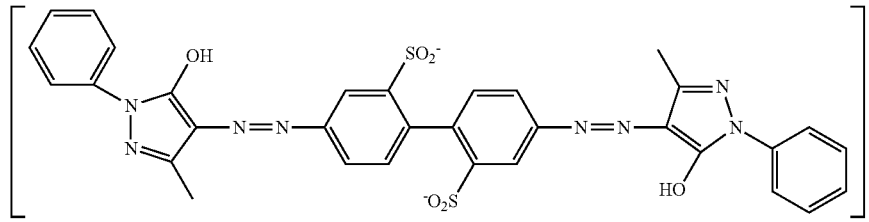

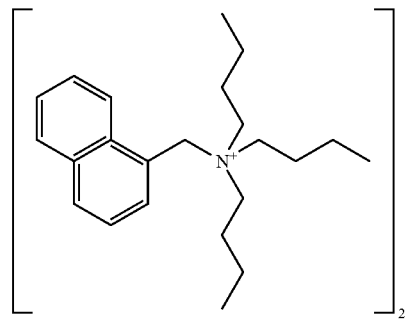

The assistance colorant according to another exemplary embodiment may be an anthraquinone-based assistance colorant represented Chemical Formula 3 below. The assistance colorant represented by the structure Chemical Formula 3 including a amine functional group may have a high transmittance in the short wavelength region of less than about 400 nm.

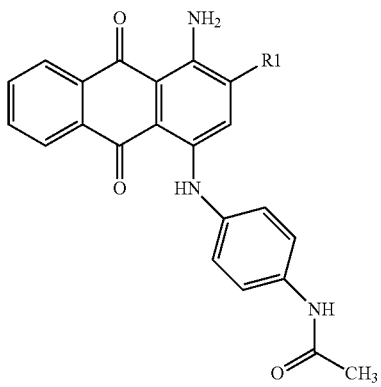

[Chemical Formula 3]

In Chemical Formula 3, R1 may be one of hydrogen, a hydroxyl group, an alkyl group with a carbon number of 1 to 30, an alkenyl group with a carbon number of 2 to 30, an oxyalkyl group with a carbon number of 1 to 30, a cycloalkyl group with a carbon number of 3 to 30, an aryl group with a carbon number of 6 to 30, derivatives thereof, or polymers thereof.

The color filter composition according to an exemplary embodiment may be used to form a color filter through a photolithography process. In the exposure step of the photolithography process, a color filter photoresist coated at a predetermined thickness on a substrate is exposed through a mask to light of a predetermined wavelength range from an ultraviolet lamp. The initiator included in the color filter photoresist absorbs ultraviolet rays to form a radical as a photocatalyst. The initiator reacts to ultraviolet rays transmitted through the resist from the surface, and the formed radical is serially transmitted to a lower portion thereof. The deeper the ultraviolet ray passes through the photoresist, the deeper the initiator forms a radical. This radical reacts with a polyfunctional monomer having several double bonds to generate a cross-linking reaction, thereby forming a chain.

Recently, a light emitting diode (LED) is largely used as the backlight of the liquid crystal display. A ratio of an assistance colorant used along with the light emitting diode (LED) has tended to be decreased compared with a material for a conventional CCFL such that the transmittance of the short wavelength region has been progressively further decreased.

In the present exemplary embodiment, an assistance colorant having high transmittance in the short wavelength region of ultraviolet rays is used rather than a yellow assistance colorant. The increased transmittance in the particular short wavelength region within about 300 nm to 400 nm in which the initiator absorbs allows the ultraviolet exposure light to be transmitted to a deeper position of the formed color filter photoresist. Because a greater depth of the initiator is exposed, the sensitivity of the color filter photoresist increases. Here, the sensitivity of the color filter photoresist may be an extent that the light uniformly transmits with film thickness of the color filter photoresist. Consequently, the photohardening step improves such that the lifting defect of the pattern may be reduced. Furthermore, the portion of the edge being attacked by the developing process decreases such that an inverse taper defect may be reduced after developing.

Finally, as the degree of photohardening increases, a margin for stains after development may be ensured, and baking time for thermal hardening may be shortened.

Figure 1:
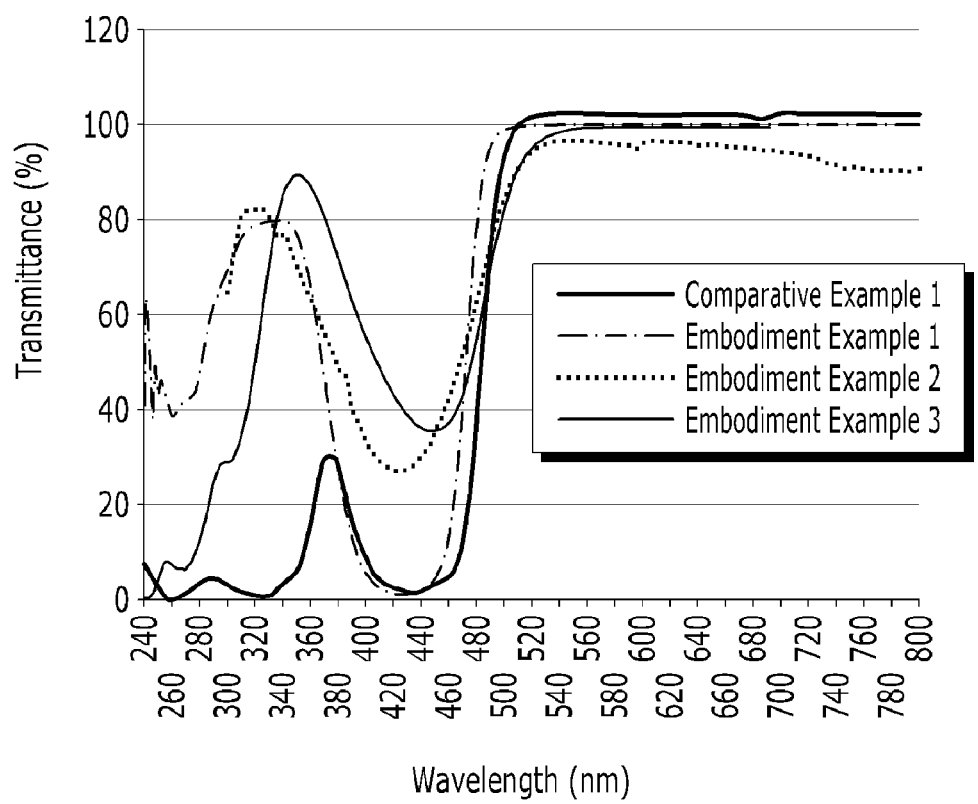
FIG. 1 is a graph of a relationship of wavelength and transmittance of an assistance colorant according to an exemplary embodiment.

FIG. 1 is a graph of a relationship of transmittance vs. wavelength of an assistance colorant according to an exemplary embodiment.

Referring to FIG. 1, when the yellow assistance colorant represented by Chemical Formula C below is employed resulting in Comparative Example 1, the transmittance of Comparative Example 1 does not exceed 30% in the short wavelength region of less than 400 nm.

[Chemical Formula C]

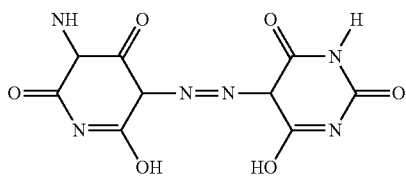

The assistance colorant represented by Chemical Formula C is made of a monoazo compound, and a single azo group as a chromophore has a characteristic of low transmittance in the short wavelength band of about 300 nm to about 400 nm.

The assistance colorants according to an exemplary embodiment represented by Chemical Formula 1 to Chemical Formula 3 have higher transmittance, as shown by Example 1 to Example 3, in the same short wavelength region as compared with Comparative Example 1.

[Chemical Formula 1]

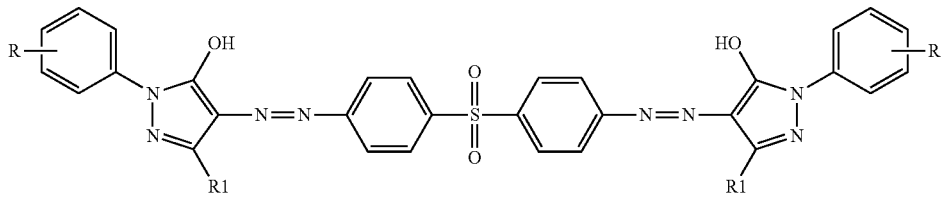

In Chemical Formula 1, R and R1 may be the same or different from each other and may be independently one of hydrogen, a hydroxyl group, an alkyl group with a carbon number of 1 to 30, an alkenyl group with a carbon number of 2 to 30, an oxyalkyl group with a carbon number of 1 to 30, a cycloalkyl group with a carbon number of 3 to 30, an aryl group with a carbon number of 6 to 30, derivatives thereof, or polymers thereof.

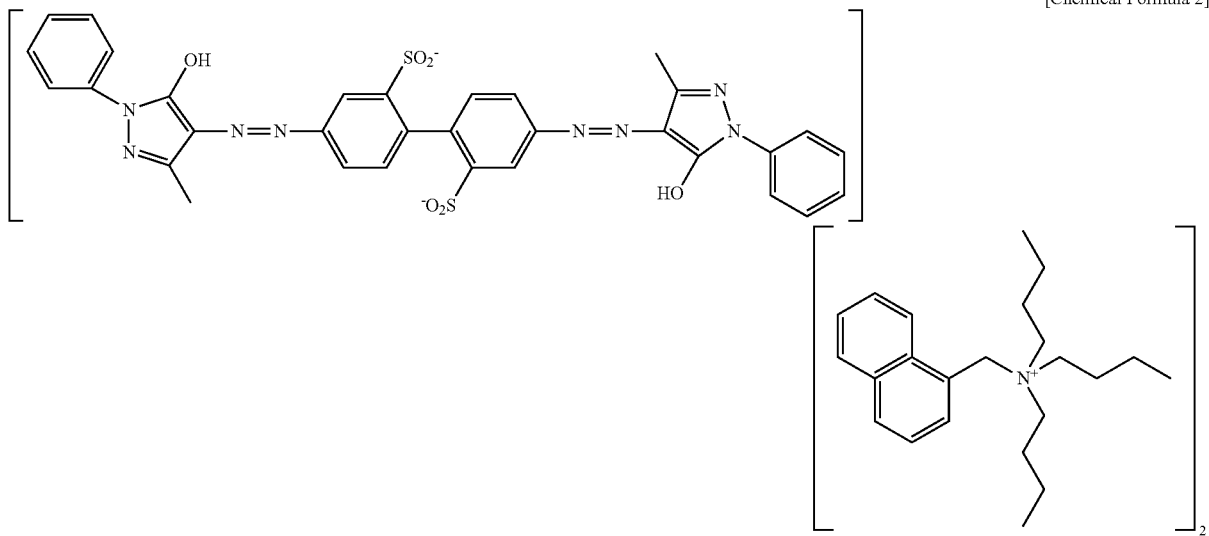

[Chemical Formula 2]

[Chemical Formula 3]

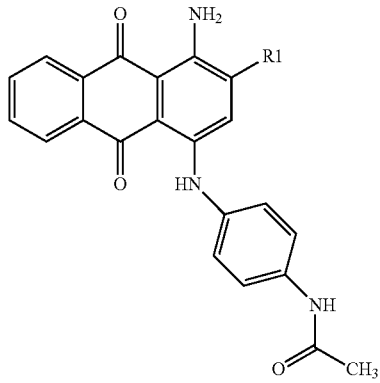

In Chemical Formula 3, R1 may be one of hydrogen, a hydroxyl group, an alkyl group with a carbon number of 1 to 30, an alkenyl group with a carbon number of 2 to 30, an oxyalkyl group with a carbon number of 1 to 30, a cycloalkyl group with a carbon number of 3 to 30, an aryl group with a carbon number of 6 to 30, derivatives thereof, or polymers thereof.

The assistance colorant represented by Chemical Formula 1 includes two azo groups, and functional groups substituted onto the sulfonyl group. For the color filter composition formulated using Chemical Formula 1 as assistance colorant, a wavelength exists in the short wavelength region of less than about 400 nm where the transmittance rises to about 80%.

The assistance colorant represented by Chemical Formula 2 has a cation of a quaternary amine, and a characteristic of forming a salt with an anion including the sulfonyl group. The assistance colorant represented by Chemical Formula 2 has a transmittance of more than about 80% in a particular wavelength band within the short wavelength region of less than about 400 nm.

Figure 2:
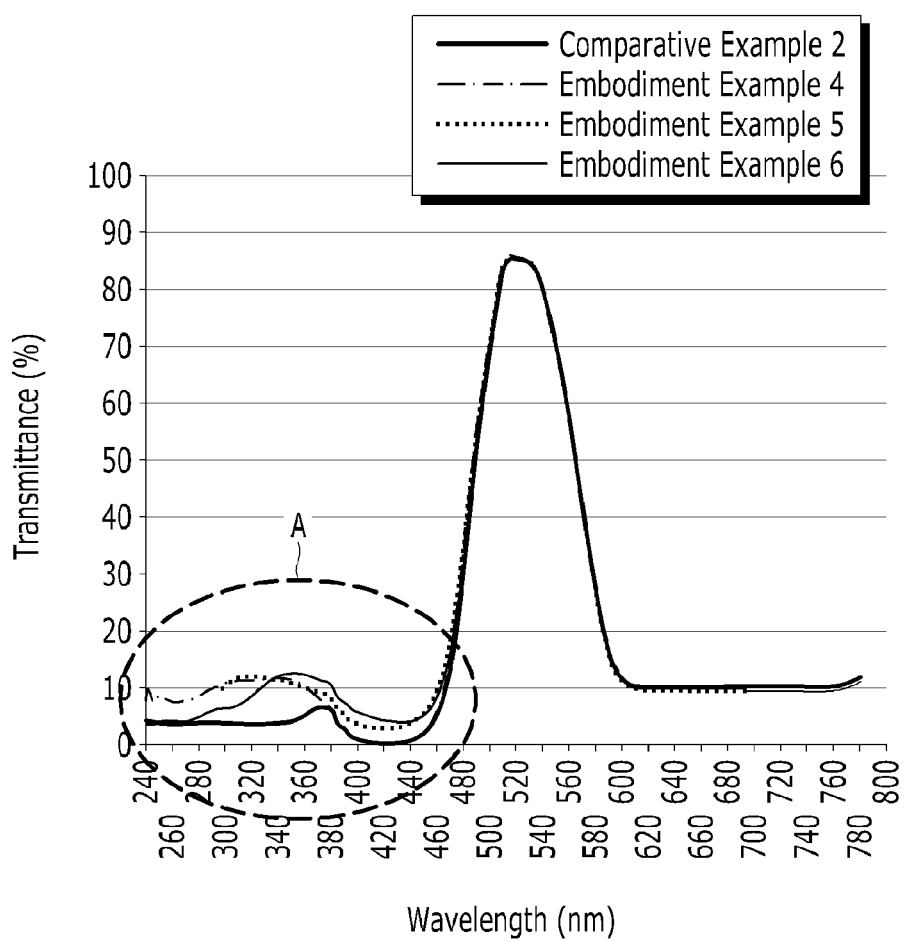
FIG. 2 is a graph of a relationship of wavelength and transmittance of a color filter composition material according to an exemplary embodiment.
Figure 3:
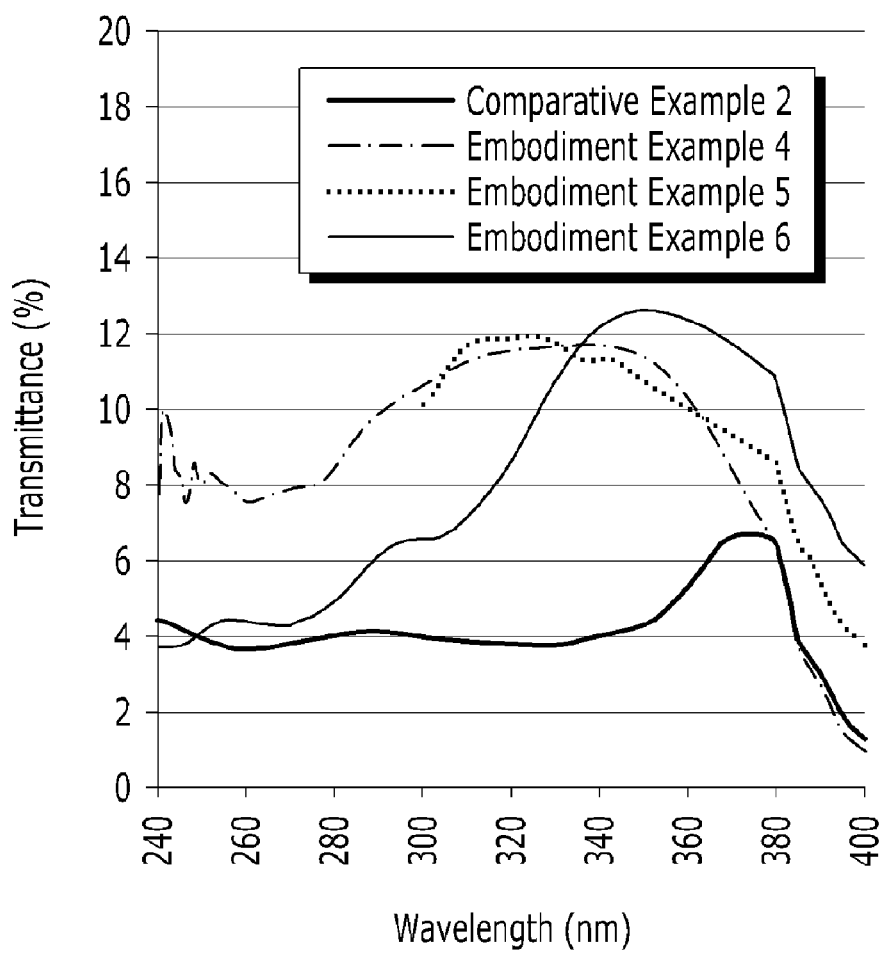
FIG. 3 is an enlarged graph of a portion A of FIG. 2.

FIG. 2 is a graph of a relationship of transmittance vs. wavelength of a color filter composition material according to an exemplary embodiment. FIG. 3 is an enlarged graph of portion A of FIG. 2, between 240 nm and 400 nm.

FIG. 2 and FIG. 3 show the simulated transmittances obtained by mixing the pigment with the assistance colorants depicted in FIG. 1. Simulated transmittances for Example 4, Example 5, and Example 6 compared with Comparative Example 2 are shown. Comparative Example 2 represents the simulated transmittance when mixing the pigment and the assistance colorant structure of Chemical Formula C.

The transmittances of the pigment mixed with the assistance colorants according to exemplary embodiments, as shown in FIG. 3, are about doubled in the short wavelength region compared with Comparative Example 2.

Figure 4:
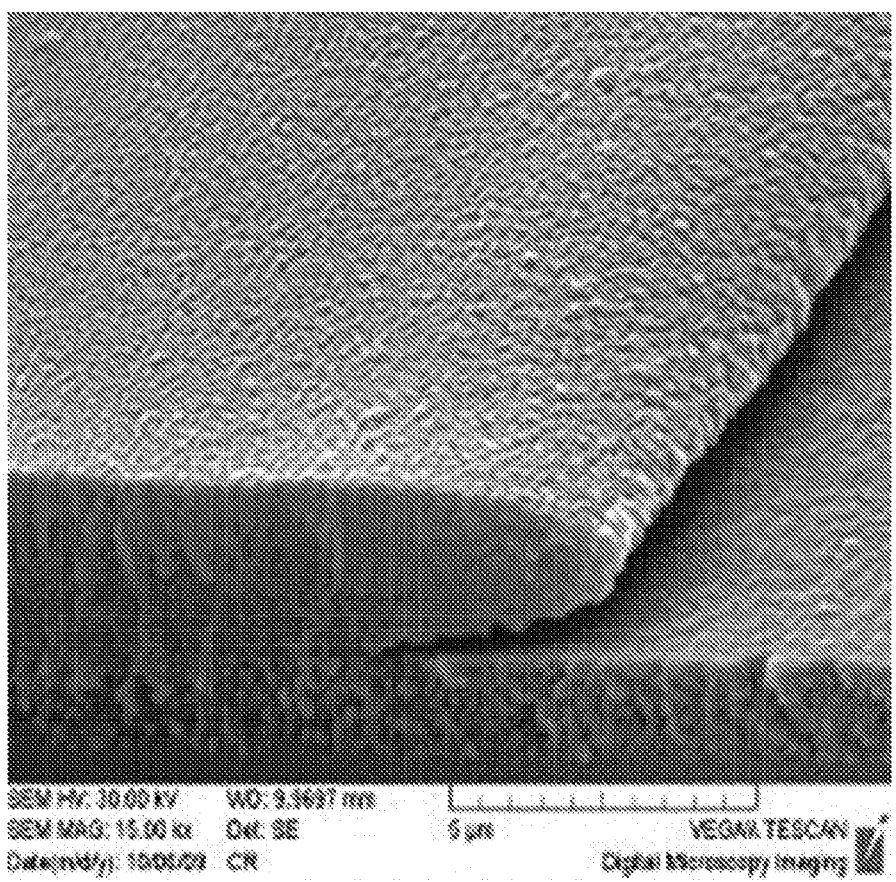
FIG. 4 and FIG. 5 are SEM pictures after a development process and after a baking process for a comparative example.
Figure 5:
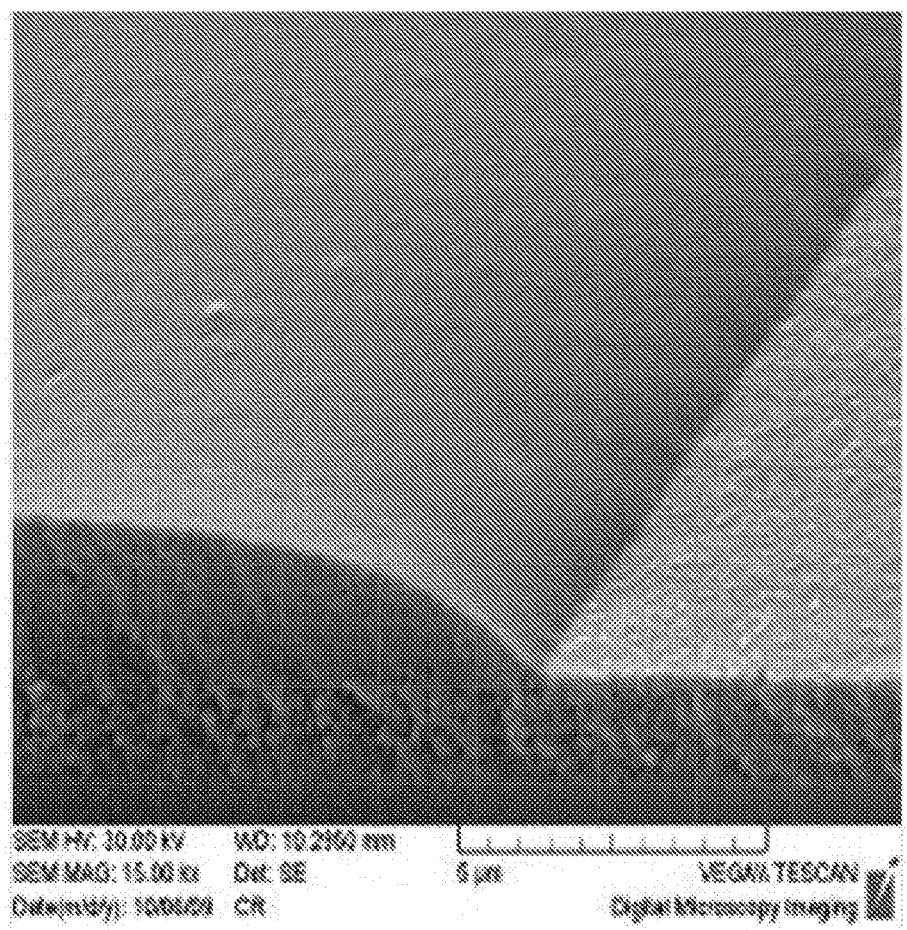

FIG. 4 and FIG. 5 are SEM pictures after the development step and after all baking steps, respectively, according to a comparative example.

Referring to FIG. 4, if the color filter photoresist mixed with the assistance colorant represented by Chemical Formula C and the pigment is coated and developed on a substrate, the edge of the developed color filter is severely undercut.

Referring to FIG. 5 taken after coating, developing and baking the color filter photoresist mixed with the assistance colorant represented by Chemical Formula C and the pigment, the width of the color filter measures about 112 um. The width of the mask used in the photolithography step is about 100 um.

FIG. 6 and FIG. 7 are SEM pictures after the development step and after all baking steps, respectively, according to an exemplary embodiment.

Referring to FIG. 6 obtained after coating and developing the composition mixed with the pigment and the assistance colorant represented by Chemical Formula 1 on the substrate, the undercut appears greatly reduced as compared with the comparative example of the assistance colorant of Chemical Formula C shown in FIG. 4.

Referring to FIG. 7, when the coating, developing, and baking steps are performed for the composition of the mixed pigment and the assistance colorant represented by Chemical Formula 1, the width of the color filter is about 119 um. The width of the mask used in the photolithography process is about 100 um.

If the baking step is performed following the photolithography step, the undercut portion is flowed such that the line width shrinks with increasing undercut, while the edge profile is smoothed. In the comparative example of FIGS. 4 and 5, the undercut of the developed color filter photoresist is severe, so the line width of the baked color filter decreases.

As shown in FIG. 6 and FIG. 7, when an assistance colorant having high transmittance in the short wavelength region is used, reduction in line width of the color filter may be prevented, which confirms that the sensitivity of the color filter composition is increased.

As the dye concentration in hybrid color filter photoresist has increased recently, it has become more difficult to optimize the color filter composition. When the amount of dye, which is formed with small-sized particles is increased, it becomes difficult to control the pattern characteristic, and control of the line width and chemical resistance deteriorate compared with the conventional color filter photoresist. These problems narrow the range in which it is possible to control a hybrid color filter composition.

According to the present exemplary embodiment, when formulating the photoresist composition material to manufacture a color filter, the combination of the composition material affecting other process characteristics remains unchanged and the appropriate yellow assistance colorant is selected, thereby improving sensitivity.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A color filter composition comprising: a colorant A including a pigment or a dye, a binder resin B, an initiator C, and an assistance colorant D is selected from the group consisting of Chemical Formula 1, Chemical Formula 2, and Chemical Formula 3;

[Chemical Formula 1]

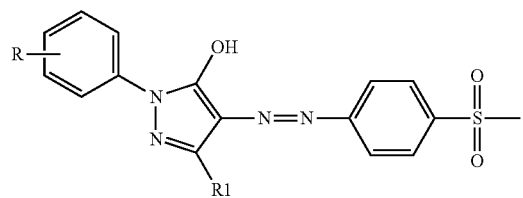

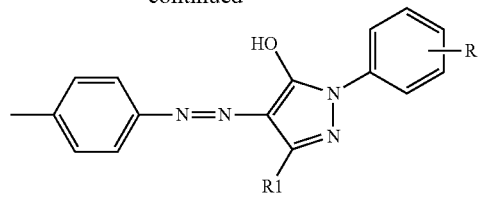

in Chemical Formula 1, R and R1 may the same or different from each other and may be one of hydrogen, a hydroxyl group, an alkyl group with a carbon number of 1 to 30, an alkenyl group with a carbon number of 2 to 30, an alkoxy group with a carbon number of 1 to 30, a cycloalkyl group with a carbon number of 3 to 30, an aryl group with a carbon number of 6 to 30, derivatives thereof, or polymers thereof;

[Chemical Formula 2]

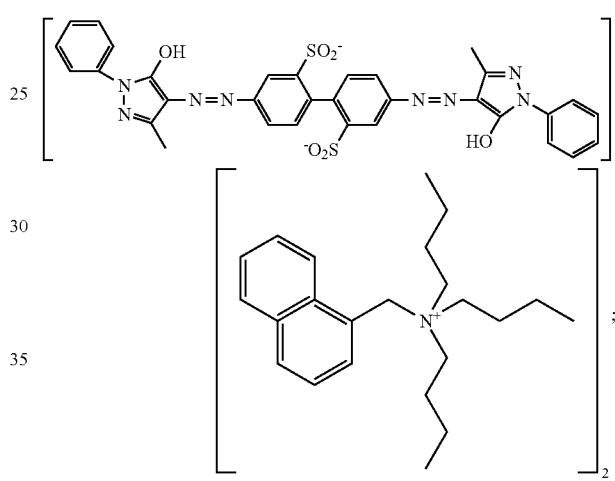

[Chemical Formula 3]

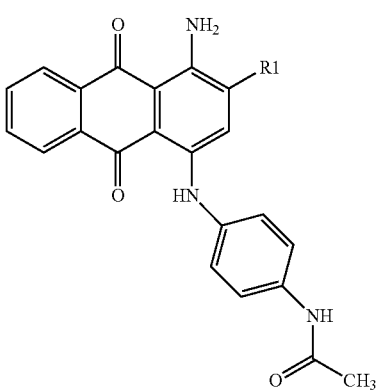

in Chemical Formula 3, R1 may be one of hydrogen, a hydroxyl group, an alkyl group with a carbon number of 1 to 30, an alkenyl group with a carbon number of 2 to 30, an alkoxy group with a carbon number of 1 to 30, a cycloalkyl group with a carbon number of 3 to 30, an aryl group with a carbon number of 6 to 30, derivatives thereof, or polymers thereof; wherein the initiator absorbs light of an ultraviolet wavelength, and the assistance colorant has a transmittance of more than about 60% in a short wavelength region, wherein the short wavelength region is in a range of about 300 nm to about 400 nm.

2. The color filter composition of claim 1, wherein the assistance colorant is a yellow assistance colorant.

3. The color filter composition of claim 2, wherein the assistance colorant includes at least two azo groups.

4. The color filter composition of claim 3, wherein the assistance colorant includes a functional group substituted into a sulfonyl group.

5. The color filter composition of claim 4, wherein the assistance colorant is represented by Chemical Formula 1 below:

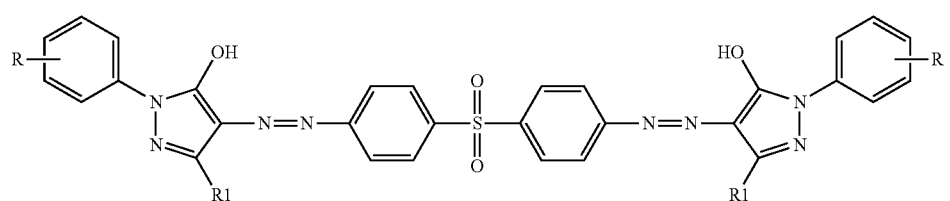

[Chemical Formula 1]

in Chemical Formula 1, R and R1 may the same or different from each other and may be one of hydrogen, a hydroxyl group, an alkyl group with a carbon number of 1 to 30, an alkenyl group with a carbon number of 2 to 30, an alkoxy group with a carbon number of 1 to 30, a cycloalkyl group with a carbon number of 3 to 30, an aryl group with a carbon number of 6 to 30, derivatives thereof, or polymers thereof.

6. The color filter composition of claim 3, wherein the assistance colorant is represented by Chemical Formula 2 below:

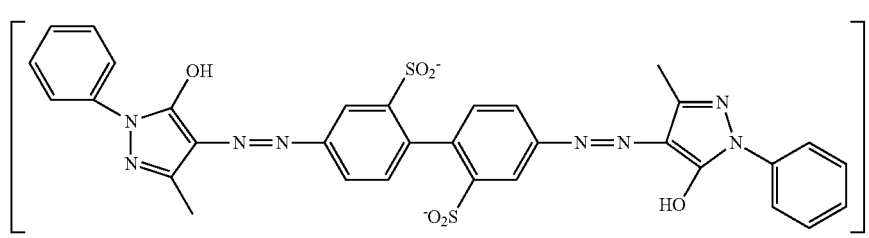

[Chemical Formula 2]

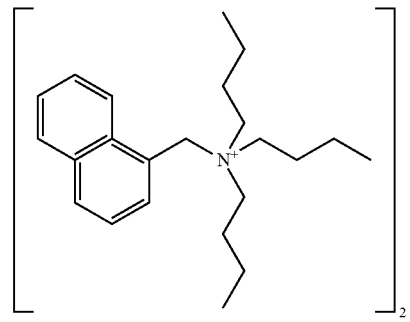

7. The color filter composition of claim 2, wherein the assistance colorant is an anthraquinone-based material.

8. The color filter composition of claim 7, wherein the assistance colorant is represented by Chemical Formula 3 below:

[Chemical Formula 3]

in Chemical Formula 3, R1 may be one of hydrogen, a hydroxyl group, an alkyl group with a carbon number of 1 to 30, an alkenyl group with a carbon number of 2 to 30, an alkoxy group with a carbon number of 1 to 30, a cycloalkyl group with a carbon number of 3 to 30, an aryl group with a carbon number of 6 to 30, derivatives thereof, or polymers thereof.

9. The color filter composition of claim 1, wherein the assistance colorant has a transmittance of more than about 80% for the wavelength region of about 300 nm to 400 nm.

* * * * *